(12) United States Patent
Fujita et al.

(10) Patent No.: US 8,472,302 B2
(45) Date of Patent: Jun. 25, 2013

(54) RECORDING DEVICE AND OPTICAL OSCILLATOR DEVICE

(75) Inventors: Goro Fujita, Kanagawa (JP); Takao Miyajima, Kanagawa (JP); Masaru Kuramoto, Kanagawa (JP); Hideki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/209,714

(22) Filed: Aug. 15, 2011

(65) Prior Publication Data

US 2012/0044793 A1 Feb. 23, 2012
US 2013/0100789 A9 Apr. 25, 2013

Related U.S. Application Data

(63) Continuation-in-part of application No. 13/052,547, filed on Mar. 21, 2011.

(30) Foreign Application Priority Data

Aug. 20, 2010 (JP) .................................. 2010-184593
May 18, 2011 (JP) .................................. 2011-111866

(51) Int. Cl.
*G11B 7/00* (2006.01)
(52) U.S. Cl.
USPC ...................................................... 369/116
(58) Field of Classification Search
USPC ....... 369/116, 120, 121, 122, 47.52; 347/248; 385/14; 398/155, 175
See application file for complete search history.

(56) References Cited

U.S. PATENT DOCUMENTS

2011/0234744 A1* 9/2011 Fujita et al. .................... 347/248
2012/0044791 A1* 2/2012 Fujita et al. ................. 369/44.25

OTHER PUBLICATIONS

Kobayashi, Seiji et al., "Introduction of volumetric optical storage technology "Micro-reflector", an ultra-mutilayer optical disk", ISOM Digest, Th-I-01, 2009, Kanagawa, Japan.
Spectra-Physics Tsunami_Series_Data_Sheet, 2008.
Kuramoto, Masaru et al., "Enormously high-peak-power optical pulse generation from a single-transverse-mode GaInN blue-violet laser diode", Applied Physics Letters, 96, Feb. 1, 2010, Institute of Physics.
Koda, Rintaro et al., "100 W peak-power 1 GHz repetition picoseconds optical pulse generation using blue-violet GaInN diode laser mode-locked oscillator and optical amplifier", Applied Physics Letters, 97, Jul. 12, 2010, American Institute of Physics.

* cited by examiner

*Primary Examiner* — Nabil Hindi
(74) *Attorney, Agent, or Firm* — Sony Corporation

(57) ABSTRACT

A recording device that records information in an optical recording medium includes: a self excited oscillation semiconductor laser including a saturable absorber section to apply a bias voltage and a gain section to inject a gain current, and also emitting a laser light to record the information in the optical recording medium; a reference signal generation unit generating a master clock signal and also supplying an injection signal synchronized with the master clock signal to the gain section of the self excited oscillation semiconductor laser; and a recording signal generation unit generating a recording signal based upon the master clock signal and also applying the recording signal to the saturable absorber section of the self excited oscillation semiconductor laser as the bias voltage.

5 Claims, 14 Drawing Sheets

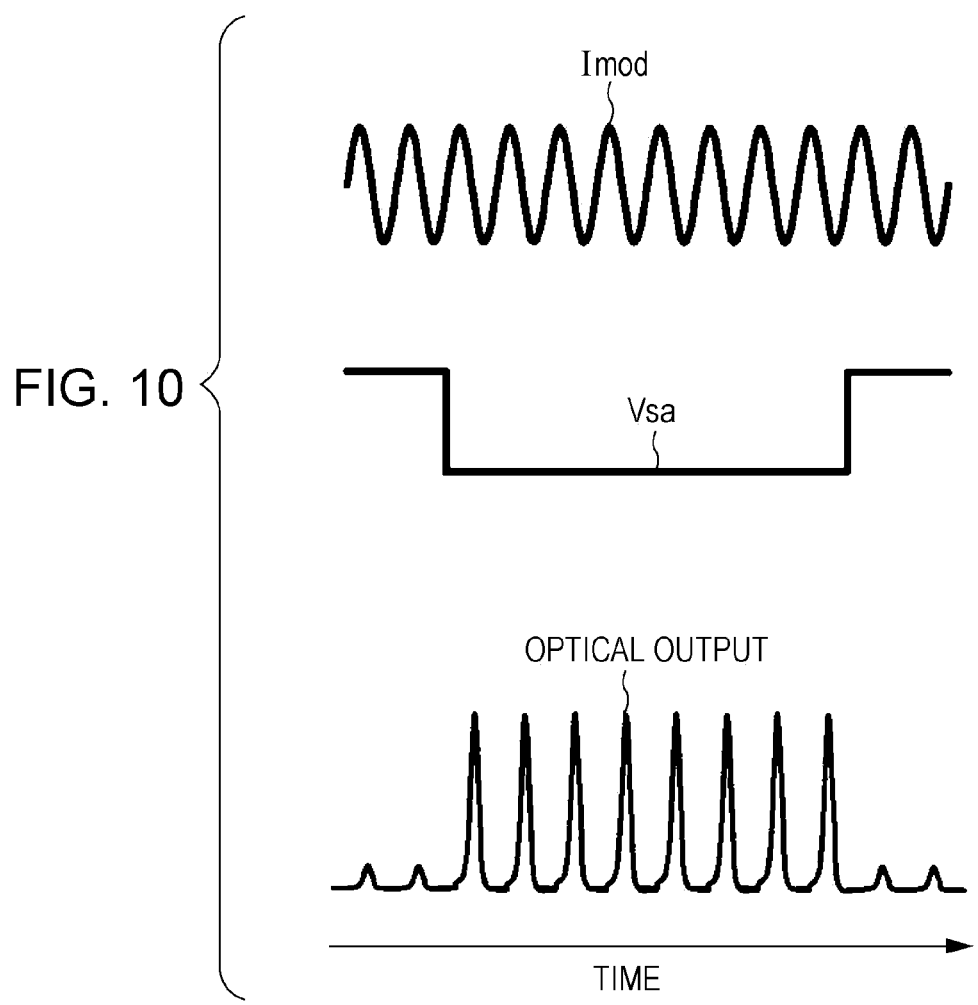

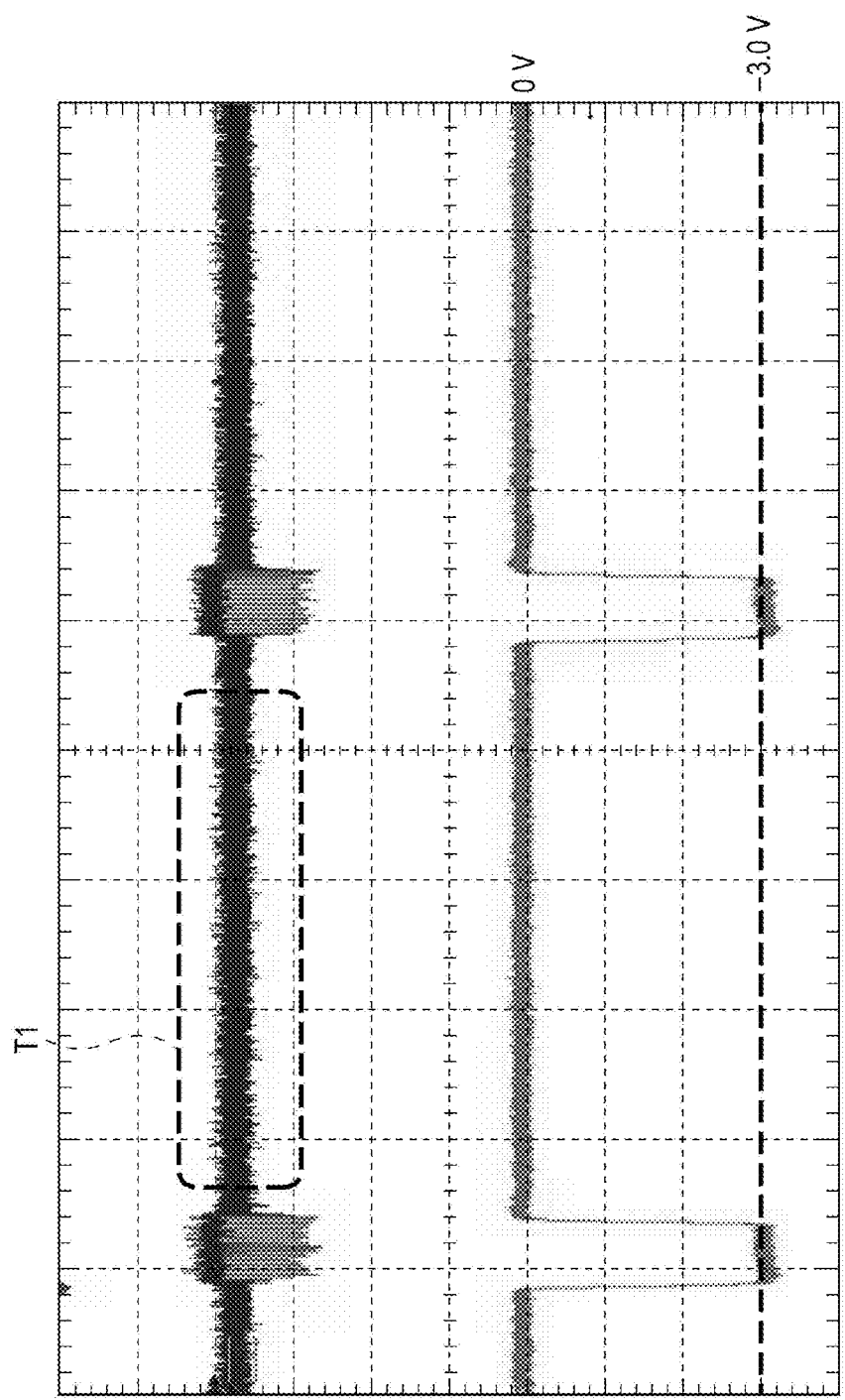

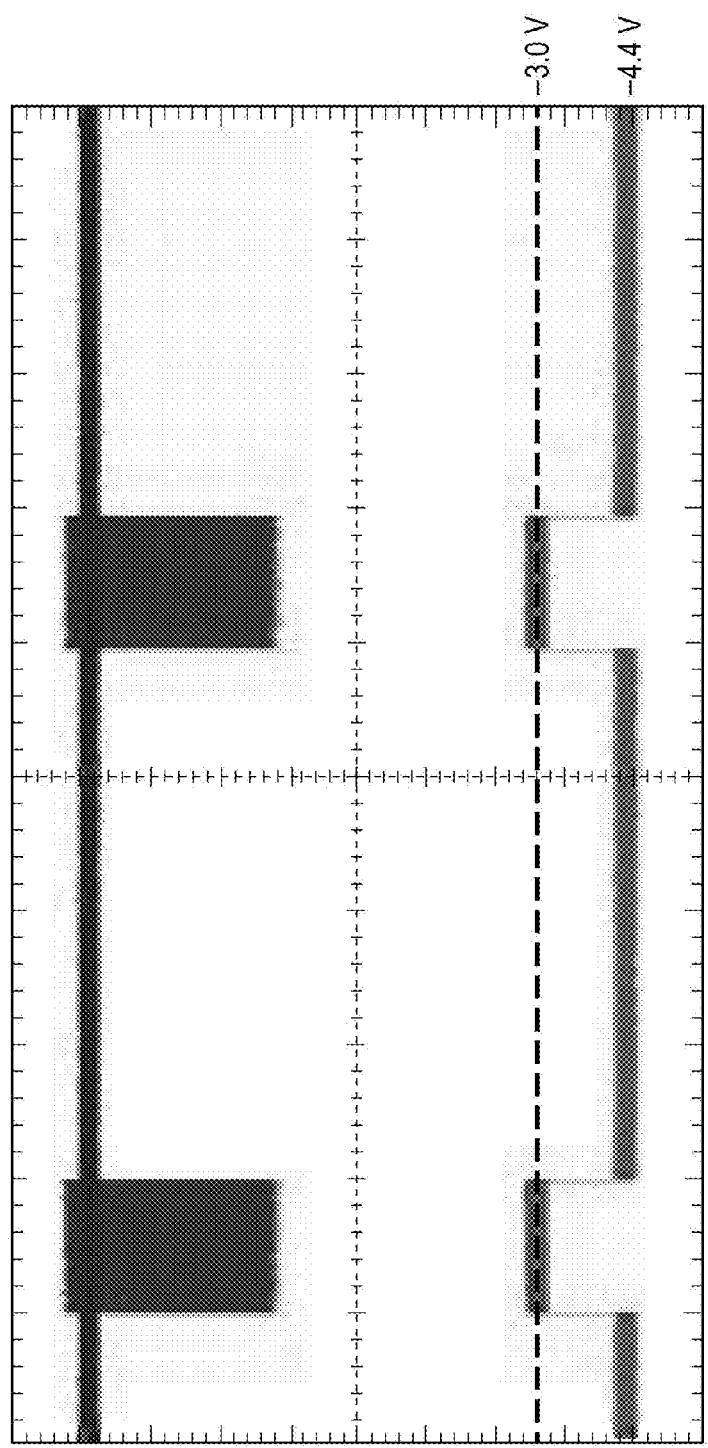

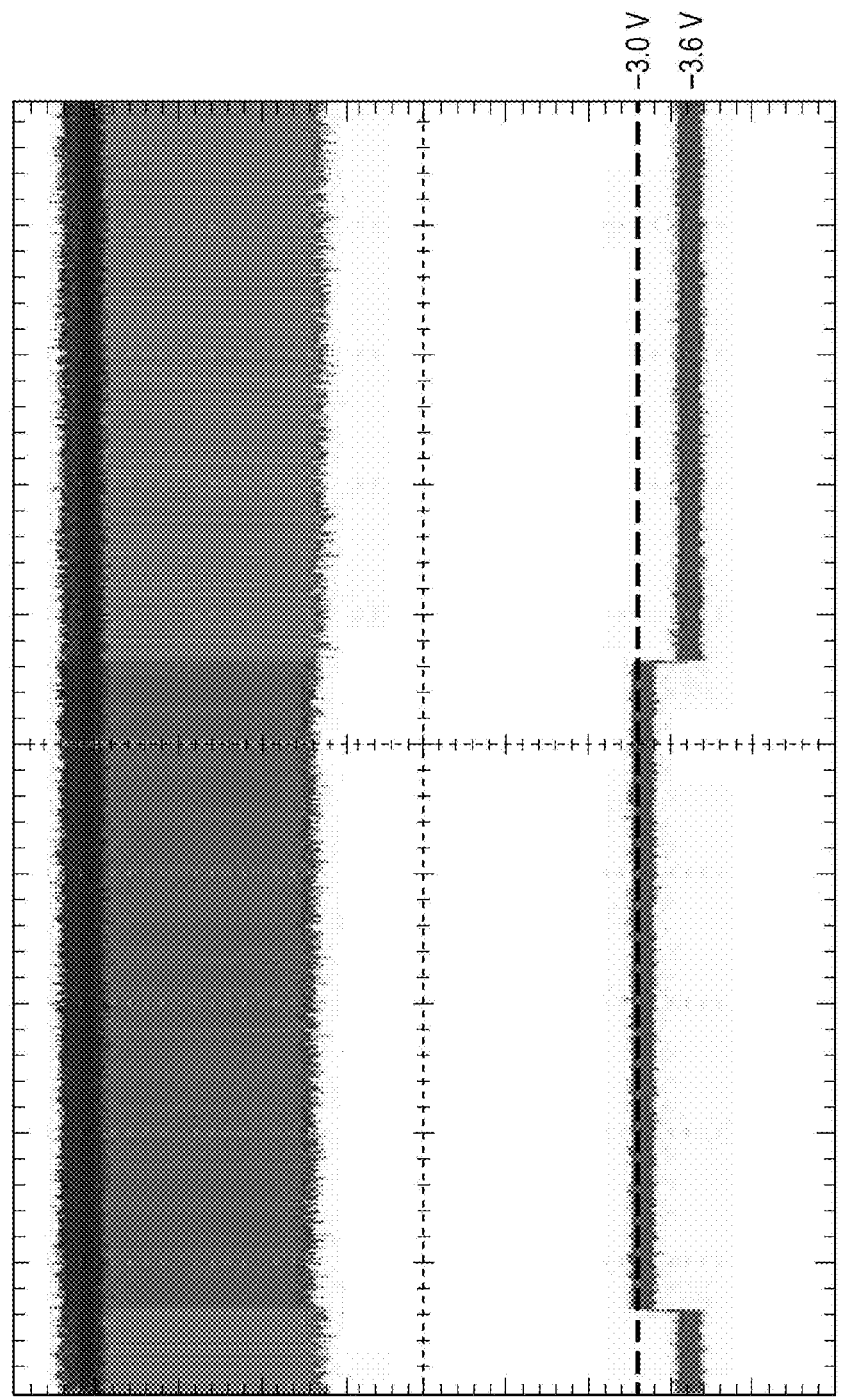

RECORDING DEVICE AND OPTICAL OSCILLATOR DEVICE

The present application is a continuation-in-part of application Ser. No. 13/052,547 filed on Mar. 21, 2011, which makes reference to, claims priority to and claims benefit from Japanese Priority Patent Application JP P2010-070924 filed in the Japan Patent Office on Mar. 25, 2010. The present disclosure contains subject matter related to that disclosed in Japanese Priority Patent Application JP 2010-184593 filed in the Japan Patent Office on Aug. 20, 2010 and Japanese Priority Patent Application JP 2011-111866 filed in the Japan Patent Office on May 18, 2011, the entire contents of which are hereby incorporated by reference.

BACKGROUND

The present disclosure relates to a recording device using a self excited oscillation semiconductor laser as a light source for recording and to an optical oscillator device using a self excited oscillation semiconductor laser.

A laser light with a high peak power, in particular an intense pulsed light is very effective for a nonlinear multiphoton absorption process.

Using this absorption process, applications to three dimensional optical recording, ultra microfabrication, nondestructive bioimaging, or the like are expected.

For example, there is reported a method for multilayer recording by irradiating a high power laser light to a transparent bulk material having a nonlinear effect (refer to Seiji Kobayashi, Kimihiro Saito, Takashi Iwamura, Hisayuki Yamatsu, Toshihiro Horigome, Mitsuaki Oyamada, Kunihiko Hayashi, Daisuke Ueda, Norihiro Tanabe and Hirotaka Miyamoto, ISOM 2009 Digest Th-1-01, 2009).

This method shows a possibility for an inexpensive and high capacity recording medium compared to a stacked disk in the past.

As a light source to emit a high power laser light, a mode locked titanium sapphire laser is used. In the example of the above ISOM 2009 Digest Th1-01 as well, a light of 810 nm emitted from a titanium sapphire laser is converted into a wavelength of 405 nm by a SHG (second harmonic generator) to be a light source for short wavelength recording that is advantageous for high density recording.

In a case of such a large and expensive solid state laser, it is limited to be applied to experiments in a laboratory (for example, refer to Spectra-Physics KK., [online], [searched on Aug. 6, 2010], Internet URL: http://www.spectra-physics.jp/member/admin/document_upload/Tsunami_Series_Data_Sheet.pdf).

With that, many researchers are trying to develop a pulsed light source that is much smaller in size and stable for practical use on a semiconductor basis.

In optical recording of next generation as the previously mentioned methods, a blue-violet laser light source is strongly desired that is advantageous for high density recording in all semiconductors.

For example, it is reported that, in a case of carrying out 1 MHz repetition due to strong excitation driving in a gain switching laser, a peak power of 55 W is attained (refer to M. Kuramoto, T. Oki, T. Sugahara, S. Kono, M. Ikeda, and H. Yokoyama, Appl. Phys. Lett. 96, 051102_2010_.).

It should be noted that, due to a demand for a high data transmission rate in the market, an even higher repetition frequency is desired in a light source for data recording as well.

A self excited oscillation GaN blue-violet semiconductor laser attains a light source that is capable of an oscillation output with a pulse width of 30 ps and 2.4 W at a frequency of 0.9 GHz (refer to Takao Miyajima, Hideki Watanabe, Masao Ikeda and Hiroyuki Yokoyama, Applied Physics Letters 94, 161103 (2009)).

This semiconductor laser is a BS (bisectional) self excited oscillation semiconductor laser configured with a gain section and a saturable absorber section.

In this semiconductor laser, a reverse bias voltage is applied to the saturable absorber section. At this time, by injecting a current to the gain section, a laser light at a wavelength of 407 nm, for example, is emitted.

In a recording and reproducing device, data is supposed to be recorded at an arbitrary location based on address information, such as a wobble signal read out of an optical recording medium. In a case of using such a self excited oscillation laser for recording, it is desired to modulate in accordance with recording data, and at the same time, to record while synchronizing a pulse of the self excited oscillation with the modulation.

SUMMARY

In a recording and reproducing device, it is desired to emit, from a light source, a wobble signal read out of an optical recording medium and a recording signal synchronized with a rotation synchronization signal from a spindle motor that rotates the optical recording medium. However, a self excited oscillation laser is generally determined to have a particular pulsed light frequency due to the structure and the driving conditions. To record data accurately, it is desired to synchronize this oscillation frequency with the recording signal from the recording device in some way.

For example, the present applicant previously proposed a method, in Japanese Patent Application No. 2010-70924, of carrying out feedback control by detecting the oscillation frequency and the phase and generating frequency and phase errors from the master clock of the recording device to add to a driving signal of the self excited oscillation laser.

It should be noted that, in a case of this method, modulation in accordance with the recording data is desired to be carried out separately. In a case of modulating a continuous light from the self excited oscillation laser by external modulation, it is basically possible to change a pulsed light frequency by using an element capable of high speed modulation, such as an EA (electro-absorption) modulator, for example.

However, when using such an external modulator, the costs naturally increase, and in a case of the EA modulator mentioned above, there is also a problem of decreasing the pulse ON/OFF ratio.

With that, in Japanese Patent Application No. 2010-70924, a semiconductor optical amplifier (SOA) is proposed that is smaller in size and inexpensive compared to an EA modulator.

However, even in the method mentioned above, two elements and an optical system to guide a light of the self excited oscillation laser to the SOA are desired. It is difficult to be made smaller in size compared to the previous single laser and the costs are expected to increase as a regulation process for the optical system is desired. Further, since a feedback operation is carried out at a high frequency of 1 GHz or more, high frequency design is desired by the circuit system as well and an increase in costs arises for the dedicated IC.

It is desirable to provide a recording device and an optical oscillator device that can easily obtain a desired pulsed light frequency with a simple configuration of a single element.

A recording device of an embodiment of the present technology is a recording device that records information in an optical recording medium.

Then, the recording device includes a self excited oscillation semiconductor laser that includes a saturable absorber section to apply a bias voltage and a gain section to inject a gain current, and also emits a laser light to record the information in the optical recording medium.

The recording device also includes a reference signal generation unit that generates a master clock signal and also supplies an injection signal synchronized with the master clock signal to the gain section of the self excited oscillation semiconductor laser. Further, the recording device includes a recording signal generation unit that generates a recording signal based upon the master clock signal and also applies the recording signal to the saturable absorber section of the self excited oscillation semiconductor laser as the bias voltage.

In addition, an optical oscillator device of another embodiment of the present technology includes a self excited oscillation semiconductor laser that includes a saturable absorber section applying a bias voltage and a gain section injecting a gain current, and also emits a laser light.

The optical oscillator device of the embodiment of the present technology also includes a reference signal generation unit that generates a master clock signal and also supplies an injection signal synchronized with the master clock signal to the gain section of the self excited oscillation semiconductor laser.

Then, the optical oscillator device of the embodiment of the present technology includes an emission signal generation unit generating a predetermined signal based upon the master clock signal, and also applies the predetermined signal to the saturable absorber section of the self excited oscillation semiconductor laser as the bias voltage.

According to the configuration of the above mentioned recording device of the embodiment of the present technology, the reference signal generation unit supplies an injection signal synchronized with a master clock signal to a gain section of a self excited oscillation semiconductor laser, and a recording signal generation unit applies a recording signal to a saturable absorber section of the self excited oscillation semiconductor laser as a bias voltage. Then, based upon the master clock signal generated in the reference signal generation unit, the recording signal is generated in the recording signal generation unit. This enables to synchronize the injection signal supplied to the self excited oscillation semiconductor laser with the recording signal and to turn on and off the laser light emitted from the self excited oscillation semiconductor laser so as to be synchronized with the recording signal.

In addition, according to the above mentioned optical oscillator device of the embodiment of the present technology, an emission signal generation unit is provided that generates a predetermined signal based upon a master clock signal and applies the predetermined signal to a saturable absorber section of a self excited oscillation semiconductor laser as a bias voltage. This enables to turn on and off the laser light emitted from the self excited oscillation semiconductor laser based upon an arbitrary signal.

According to the embodiments of the present technology mentioned above, even without provided with a modulation mechanism to modulate a laser light from the self excited oscillation semiconductor laser, it becomes possible to turn on and off the laser light. Then, a laser light can be emitted with an accurate pulse.

Accordingly, in the recording device and the optical oscillator device using a self excited oscillation semiconductor laser, it becomes possible to make a light source section including the self excited oscillation semiconductor laser to be smaller in size.

BRIEF DESCRIPTION OF THE DRAWINGS

FIG. 10 illustrates a pulsed current Imod, a reverse bias voltage, and an optical output from the self excited oscillation semiconductor laser in comparison;

FIG. 12A illustrates a temporal change in an optical output from a self excited oscillation semiconductor laser, and FIG. 12B illustrates the supplied bias voltage;

FIG. 13A illustrates a temporal change in an optical output from a self excited oscillation semiconductor laser, and FIG. 13B illustrates the supplied bias voltage;

FIG. 14A illustrates a temporal change in an optical output from a self excited oscillation semiconductor laser, and FIG. 14B illustrates the supplied bias voltage;

DETAILED DESCRIPTION OF EMBODIMENTS

Modes for carrying out the present technology (hereinafter, referred to as embodiments) are described below.

The description is given in the following order.
1. One Mode of Self Excited Oscillation Semiconductor Laser according to Recording Device of Embodiment of Present Technology
2. Embodiment
3. Another Embodiment
4. Experimental Examples

1. One Mode of Self Excited Oscillation Semiconductor Laser According to Recording Device of Embodiment of Present Technology Firstly, prior to a description of a recording device of an embodiment of the present technology, a description is given to an optical oscillator device used in the recording device of the embodiment of the present technology.

Figure 1A:
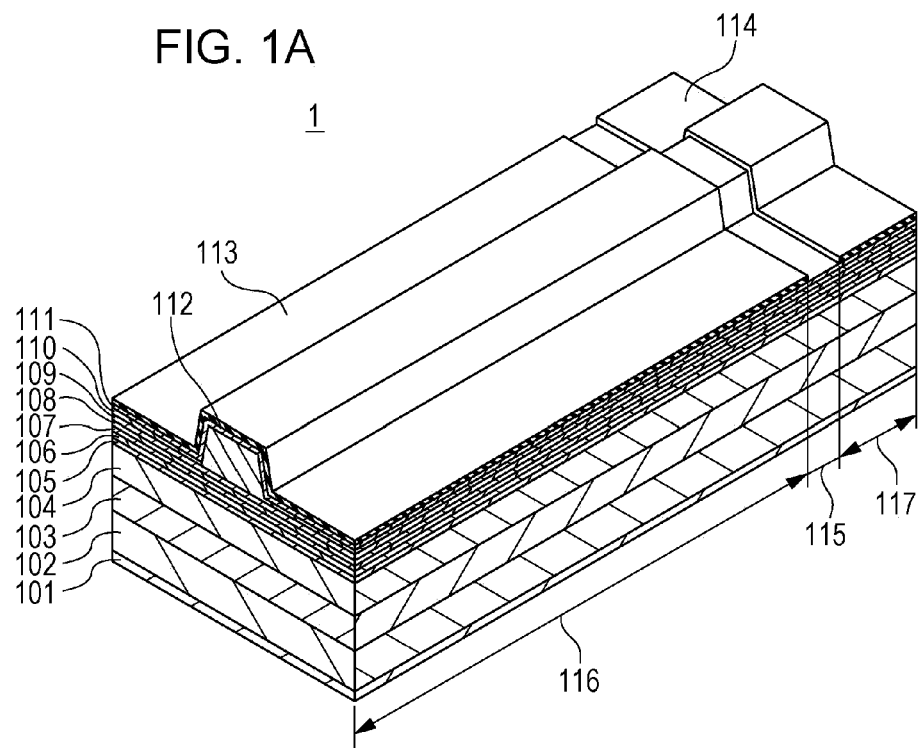
FIGS. 1A and 1B are schematic configuration diagrams of one mode of a self excited oscillation semiconductor laser according to a recording device of an embodiment of the present technology.
Figure 1B:
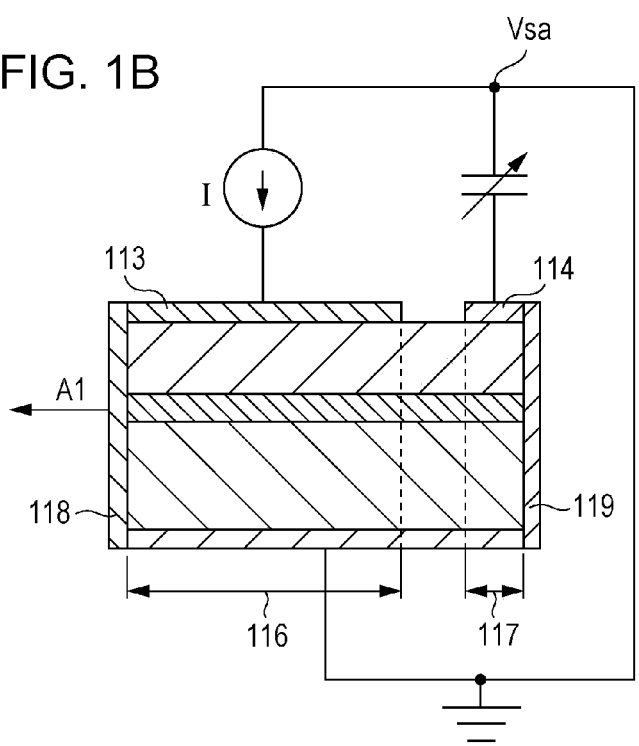

Schematic configuration diagrams of one mode of a self excited oscillation semiconductor laser according to the recording device of the embodiment of the present technology are shown in FIGS. 1A and 1B. FIG. 1A shows a perspective view of the self excited oscillation semiconductor laser, and FIG. 1B shows a pattern diagram of a state in which a laser light is emitted from the self excited oscillation semiconductor laser.

A self excited oscillation semiconductor laser 1 shown in FIGS. 1A and 1B has a configuration disclosed in the above ISOM 2009 Digest Th-l-01.

The self excited oscillation semiconductor laser 1 is, as shown in FIG. 1A, configured with a gain section 116 and a saturable absorber section 117. That is, this is a BS (bisectional) self excited oscillation semiconductor laser.

By being provided with the saturable absorber section 117, the absorption rate decreases as the intensity of a light incident to the absorber becomes higher, and only the high intensity pulse can be transmitted, so that a narrower pulse is obtained.

To the gain section 116, a gain current is injected.

On a (0001) surface of an n-type GaN substrate 102, a double quantum well separate confinement heterostructure is formed with a GaInN/GaN/AlGaN material.

This heterostructure can be formed by, for example, an MOCVD (metal organic chemical vapor deposition) technique.

That is, an n-type GaN layer 103, an n-type AlGaN clad layer 104, an n-type GaN guiding layer 105, a double quantum well active layer 106, a p-type GaInN guiding layer 107, a p-type AlGaN first clad layer 108, and a p-type AlGaN electronic barrier layer 109 are stacked. Further thereon, a p-type GaN/AlGaN superlattice second clad layer 110 is formed.

At the center of the p-type GaN/AlGaN superlattice second clad layer 110, as shown in FIG. 1A, a ridge structure is formed, and a p-type GaN layer 112 is formed on the top surface of the ridge. On the side surfaces of the ridge and on the areas of the p-type GaN/AlGaN superlattice second clad layer 110 on which the ridge is not formed, a $SiO_2$/Si insulating layer 111 is formed.

On the p-type GaN layer 112 and the $SiO_2$/Si insulating layer 111, p-type electrodes 113 and 114 are formed by an ohmic contact.

That is, the electrode 113 is formed on the gain section 116 and the electrode 114 is formed on the saturable absorber section 117. These electrodes 113 and 114 are separated by a separation section 115, for example, in a groove shape with a width of 20 µm and are electrically separated from each other. The main electrode 113 and the auxiliary electrode 114 have a length of, for example, 520 µm and 60 µm, respectively.

On a bottom surface of the n-type GaN substrate 102, an n-type lower electrode 101 is formed by an ohmic contact.

On a cleavage surface of a front surface of the gain section 116, an anti-reflection film (refer to FIG. 1B) 118 having a reflection rate of 10% is coated, and on a cleavage surface of a rear surface of the saturable absorber section 117, a highly reflective film (refer to FIG. 1B) 119 having a reflection rate of 95% is coated.

As shown in FIG. 1B, in the self excited oscillation semiconductor laser 1, a reverse bias voltage Vsa is applied to the saturable absorber section 117 by the auxiliary electrode 114. At this time, by injecting a current I from the main electrode 113 to the gain section 116, a laser light is emitted in a direction shown with an arrow A1.

The present proposers have found that the pulsed light frequency of a laser light can be controlled by changing a bias voltage to be applied to the saturable absorber section 117 against the self excited oscillation semiconductor laser 1.

Figure 2A:
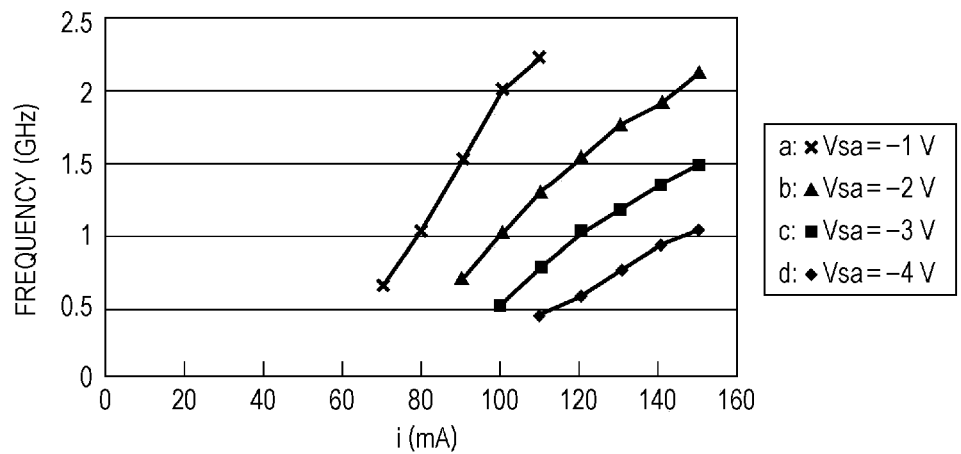
FIG. 2A illustrates relationship between a gain current of the self excited oscillation semiconductor laser and a frequency of a pulse of a laser light.

Here, an investigation was made as to the pulsed light frequency of a laser light that is oscillated when making the bias voltage to be applied to the saturable absorber section 117 to be constant and the current to be injected to the gain section 116 to be changed. Results are shown in FIG. 2A. In FIG. 2A, the horizontal axis shows the amount i (mA) of current injected to the gain section 116, and the vertical axis shows the pulsed light frequency (GHz) of the oscillated laser light.

A symbol a is a case that the bias voltage Vsa is −1 V, a symbol b is a case that the bias voltage Vsa is −2 V, a symbol c is a case that the bias voltage Vsa is −3 V, and a symbol d is a case that the bias voltage Vsa is −4 V.

From FIG. 2A, it is understood that the pulsed light frequency of the laser light becomes higher as the amount of current injected to the gain section 116 becomes higher. It is also understood that, when the current is constant, the pulsed light frequency of the laser light changes corresponding to the change in the bias voltage and the pulsed light frequency decreases as the value of the bias voltage goes in a negative direction.

Figure 2B:
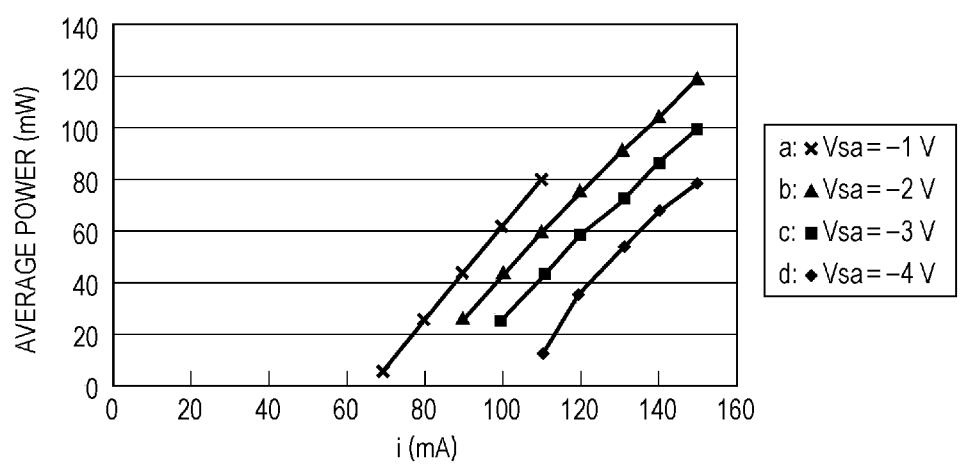
FIG. 2B illustrates relationship between a gain current of the self excited oscillation semiconductor laser and an average power of the laser light.

In self excited oscillation semiconductor laser 1, an investigation was made as to an average power of a laser light that is oscillated when making the bias voltage to be applied to the saturable absorber section 117 to be constant and the current to be applied to the gain section 116 to be changed. Results are shown in FIG. 2B. In FIG. 2B, the horizontal axis shows the amount i (mA) of current injected to the gain section 116, and the vertical axis shows the average power (mW) of the oscillated laser light.

A symbol a is a case that the bias voltage Vsa is −1 V, a symbol b is a case that the bias voltage Vsa is −2 V, a symbol c is a case that the bias voltage Vsa is −3 V, and a symbol d is a case that the bias voltage Vsa is −4 V.

From this FIG. 2B, it is understood that the average power of the laser light becomes higher as the amount of current injected to the gain section 116 becomes higher. In addition, when the current is constant, the average power of the laser light decreases as the value of the bias voltage goes in a negative direction.

When the bias voltage is changed, as understood from FIG. 2B, the average power of the laser light also changes. However, the average power of the laser light is also possible to be changed by the amount of current injected to the gain section 116. That is, by regulating the amount of injected current, a change in the average power of the laser light created by the change in the bias voltage can be cancelled. This enables to control so as to change the pulsed light frequency while usually making the average power of a laser light to be constant. Similarly, by correcting a control target value of the average power corresponding to the increase of the pulse number per unit time due to the frequency change, it is also possible to make the peak power to be constant.

In the recording device of the embodiment of the present technology, a self excited oscillation semiconductor laser, such as the self excited oscillation semiconductor laser 1 shown in FIGS. 1A and 1B is used as a light source for recording.

In the recording device of the embodiment of the present technology, the configuration of the self excited oscillation semiconductor laser to be used is not limited to the configuration of the self excited oscillation semiconductor laser 1 shown in FIGS. 1A and 1B, and it is also possible to use a self excited oscillation semiconductor laser with other configurations.

From the self excited oscillation semiconductor laser 1 mentioned above using a double quantum well separate confinement heterostructure with a GaInN/GaN/AlGaN material, a laser light at a wavelength of 407 nm is emitted.

In accordance with the wavelength of the laser light used for the information recording in the recording device, the semiconductor material for the self excited oscillation semiconductor laser 1 is selected.

2. Embodiment

Subsequently, a description is given to a recording device of an embodiment of the present technology.

Figure 3:
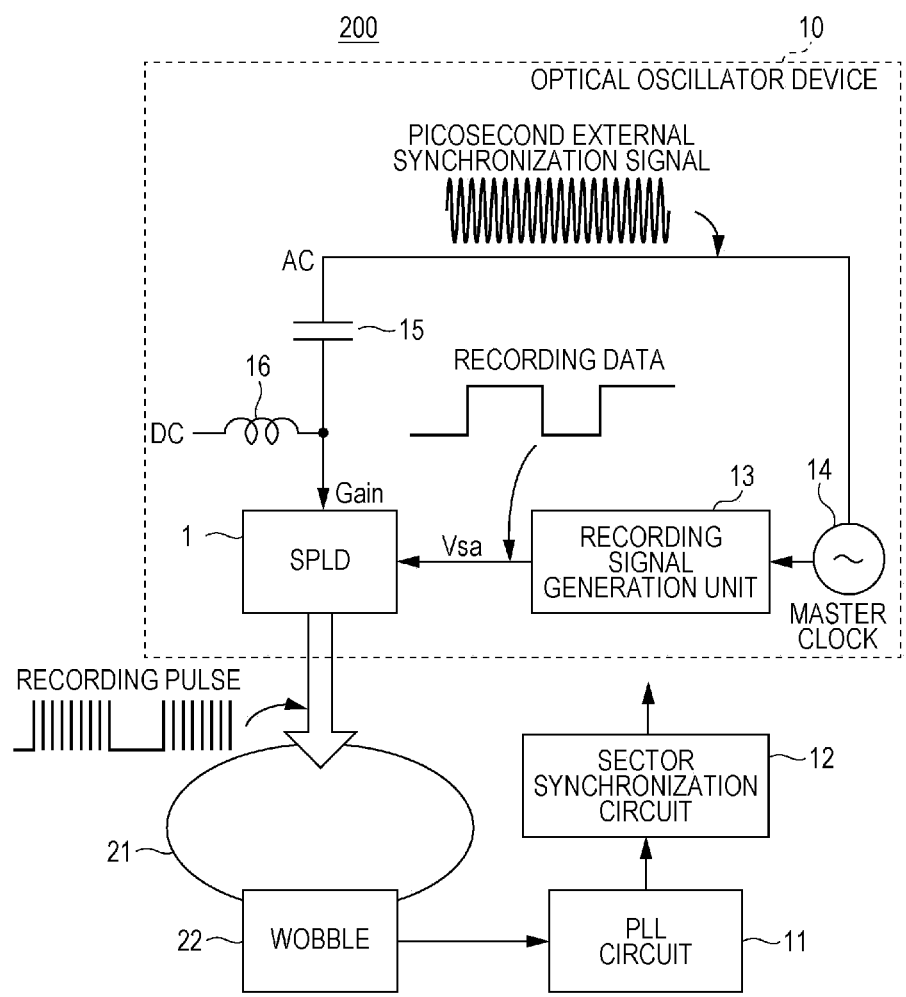
FIG. 3 is a schematic configuration diagram of a recording device of an embodiment of the present technology.

A schematic configuration diagram of the recording device of the embodiment of the present technology is shown in FIG. 3.

A recording device 200 shown in FIG. 3 is provided with an optical oscillator device 10, a PLL circuit (phase synchronization circuit) 11, and a sector synchronization circuit 12.

Further, although not shown, it is provided with an optical system for collimated radiation of a laser light emitted from the self excited oscillation semiconductor laser 1 to an optical recording medium 21 and with various circuits for signal processing and operational control of the recording device.

The optical oscillator device 10 of the present embodiment is configured with a self excited oscillation semiconductor laser 1 to emit a laser light, a recording signal generation unit 13, a reference clock generation unit 14, and a bias Tee by a capacitor 15 and a coil 16.

A laser light emitted from the self excited oscillation semiconductor laser 1 is collected on the optical recording medium 21 by the optical system, not shown. The optical recording medium 21 is rotated by a spindle motor, not shown. The collection spot of the laser light is moved in a radial direction of the optical recording medium 21 at any time by a threaded motor, not shown, or the like.

In a recording device for an optical recording medium in the past, a data clock is generated with reference to the wobble formed in the groove of the optical recording medium. Then, the semiconductor laser is controlled in synchronization with the data clock to record information.

In the recording device 200 of the present embodiment as well, the point of referring to wobble 22 formed in the groove of the optical recording medium 21 is same. It should be noted, though, that the wobble 22 is used as a synchronization signal not to generate a data clock but to detect an address and to transmit a starting position of the recording sector. Based on this timing, a recording signal synchronized with the master clock is generated at the recording signal generation unit 13 to be supplied to the semiconductor laser as recording data, and an injection signal similarly synchronized with the master clock is supplied to the semiconductor laser, thereby controlling the self excited oscillation semiconductor laser 1.

The recording sector synchronization signal obtained from the wobble 22 of the optical recording medium 21 is supplied to the recording signal generation unit 13 via the PLL circuit 11 and the sector synchronization circuit 12.

The reference clock generation unit 14 generates a master clock signal. The master clock signal generated by the reference clock generation unit 14 is sent to the recording signal generation unit 13.

The injection signal (picosecond external synchronization signal in FIG. 3) synchronized with the master clock signal is supplied from the reference clock generation unit 14 to the capacitor 15 of the bias Tee connected to a gain section Gain of the self excited oscillation semiconductor laser 1. To the coil 16 of the bias Tee, a direct current is supplied. At that time, the direct current is supplied in conditions close to the oscillation target frequency of the self excited oscillation laser. In such a manner, via the bias Tee (the capacitor 15 and the coil 16), the direct current desired for self excited oscillation and the alternating current synchronized with the master clock signal is supplied to the gain section Gain of the self excited oscillation semiconductor laser 1. The "external synchronization signal" in FIG. 3 is a signal synchronized with the master clock that is supplied from outside the self excited oscillation semiconductor laser 1.

In the recording signal generation unit 13, a recording signal is generated by placing the recording data (waveform signal shown in FIG. 3) in accordance with the master clock signal generated by the reference clock generation unit 14.

The generated recording signal is inputted to the self excited oscillation semiconductor laser 1 as the bias voltage Vsa, and the recording signal can be placed on the laser light from the self excited oscillation semiconductor laser 1.

Then, it becomes possible to usually synchronize the pulsed light (recording pulse) emitted from the self excited oscillation semiconductor laser 1, the recording signal, and the master clock signal.

In such a manner, since the recording device 200 according to the present embodiment uses the self excited oscillation semiconductor laser 1 shown in FIGS. 1A and 1B as the light source, the initial frequency of the pulsed light of self excited oscillation can be set by the current and the voltage.

Therefore, the pulsed light emitted from the self excited oscillation semiconductor laser 1 can be usually synchronized with the master clock signal, which is an electric signal, and the recording signal and the modulation signal that are formed based upon the master clock signal.

This enables to usually carry out accurate data recording in the recording device 200 according to the present embodiment.

According to the above mentioned recording device 200 of the present embodiment, the recording signal generation unit 13 generates the recording signal based upon the master clock signal generated in the reference signal generation unit 14 and the signal obtained from the wobble 22 of the optical recording medium 21. Then, this recording signal is applied to the saturable absorber section of the self excited oscillation semiconductor laser 1 as the bias voltage Vsa. From the reference signal generation unit 14, the injection signal synchronized with the master clock signal is supplied to the gain section of the self excited oscillation semiconductor laser 1.

This enables to synchronize the recording signal with the master clock signal and also to turn on and off the laser light emitted from the self excited oscillation semiconductor laser 1 so as to be synchronized with the recording signal.

Then, it becomes possible to carry out information recording to the optical recording medium 21 by turning on and off the laser light even without provided with a modulation mechanism to modulate a laser light from the self excited oscillation semiconductor laser 1.

In addition, a laser light can be emitted with an accurate pulse.

Accordingly, it becomes possible to make the light source section including the self excited oscillation semiconductor laser 1 to be smaller in size.

Regarding the optical oscillator device 10 of the present embodiment, although an example is given in which the laser light corresponding to the recording signal to the optical recording medium 21 is emitted from the self excited oscillation semiconductor laser 1 by the recording signal generation unit 13, the laser light emitted from the self excited oscillation semiconductor laser 1 may correspond to an arbitrary signal.

That is, in the optical oscillator device 10, an optical oscillator device to emit a laser light corresponding to an arbitrary signal may also be configured by using an emission signal generation unit to generate an arbitrary signal instead of the recording signal generation unit 13. It should be noted that, in this case, the other configurations of this optical oscillator device may be the same as those of the optical oscillator device 10.

In this configuration, the emission signal generation unit applies an arbitrary signal generated based upon the master clock signal to the saturable absorber section of the self excited oscillation semiconductor laser 1 as the bias voltage.

Since the signal generated in the emission signal generation unit is arbitrary, this optical oscillator device is applicable as a light source in various applications, such as microfabrication and bioimaging.

3. Another Embodiment

Figure 4:
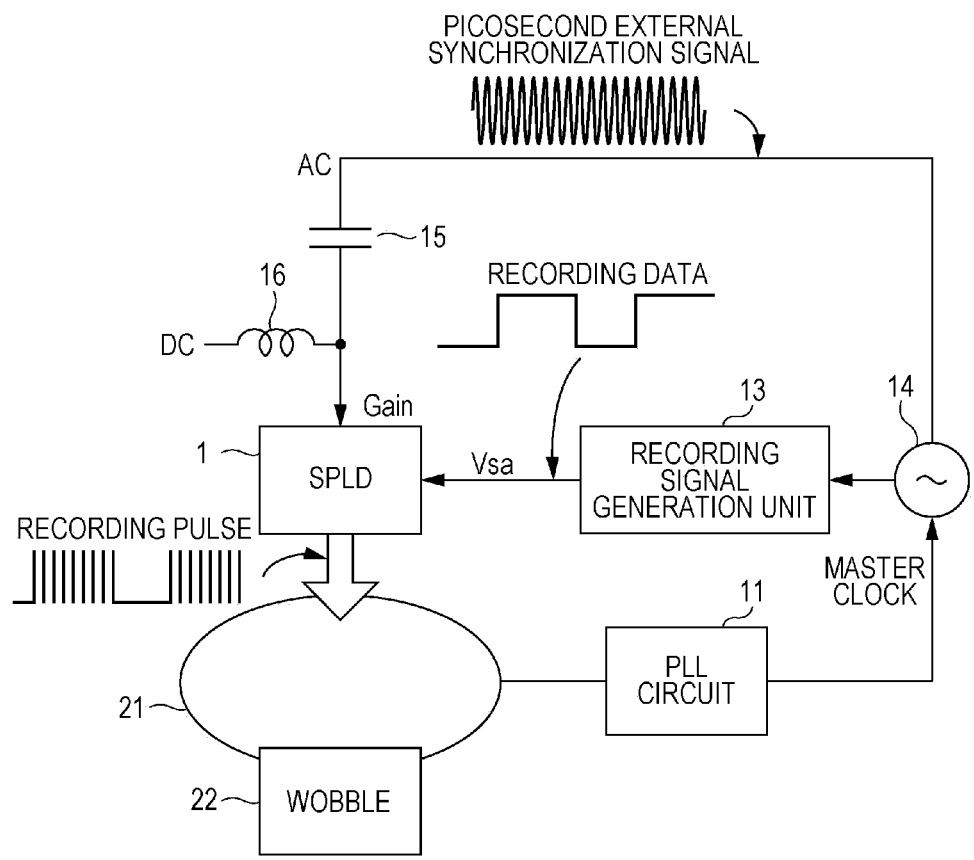
FIG. 4 is a schematic configuration diagram of a recording device of another embodiment of the present technology.

A schematic configuration diagram of a recording device of another embodiment of the present technology is shown in FIG. 4.

In a recording device 300 of the other embodiment shown in FIG. 4, the sector synchronization circuit 12 of the recording device 200 in the previous embodiment is not provided. A signal from the optical recording medium 21 via the PLL circuit 11 is configured to be sent not to the recording signal generation unit 13 but to the reference signal generation unit 14.

This enables to synchronize the external injection signal with the signal obtained from the wobble 22 of the optical recording medium 21 in the reference signal generation unit 14.

The other configurations are similar to those of the recording device 200 of the previous embodiment shown in FIG. 3, so that repetitive descriptions are omitted by assigning identical reference numerals.

According to the above mentioned recording device 300 of the present embodiment, the recording signal generation unit 13 generates a recording signal based upon the master clock signal generated in the reference signal generation unit 14 and the signal obtained from the wobble 22 of the optical recording medium 21. Then, this recording signal is applied to the saturable absorber section of the self excited oscillation semiconductor laser 1 as the bias voltage Vsa. The injection signal synchronized with the master clock signal is supplied from the reference signal generation unit 14 to the gain section of the self excited oscillation semiconductor laser 1.

This enables to synchronize the recording signal with the master clock signal and also to turn on and off the laser light emitted from the self excited oscillation semiconductor laser 1 so as to be synchronized with the recording signal.

Then, it becomes possible to carry out information recording to the optical recording medium 21 by turning on and off the laser light even without provided with a modulation mechanism to modulate a laser light from the self excited oscillation semiconductor laser 1.

In addition, a laser light can be emitted with an accurate pulse.

Accordingly, it becomes possible to make the light source section including the self excited oscillation semiconductor laser 1 to be smaller in size.

4. Experimental Examples

Experiment 1

Here, using the self excited oscillation semiconductor laser 1 shown in FIGS. 1A and 1B, an experiment was carried out to operate to synchronize light emission with a pulse width of picoseconds with the master clock signal.

Figure 5:
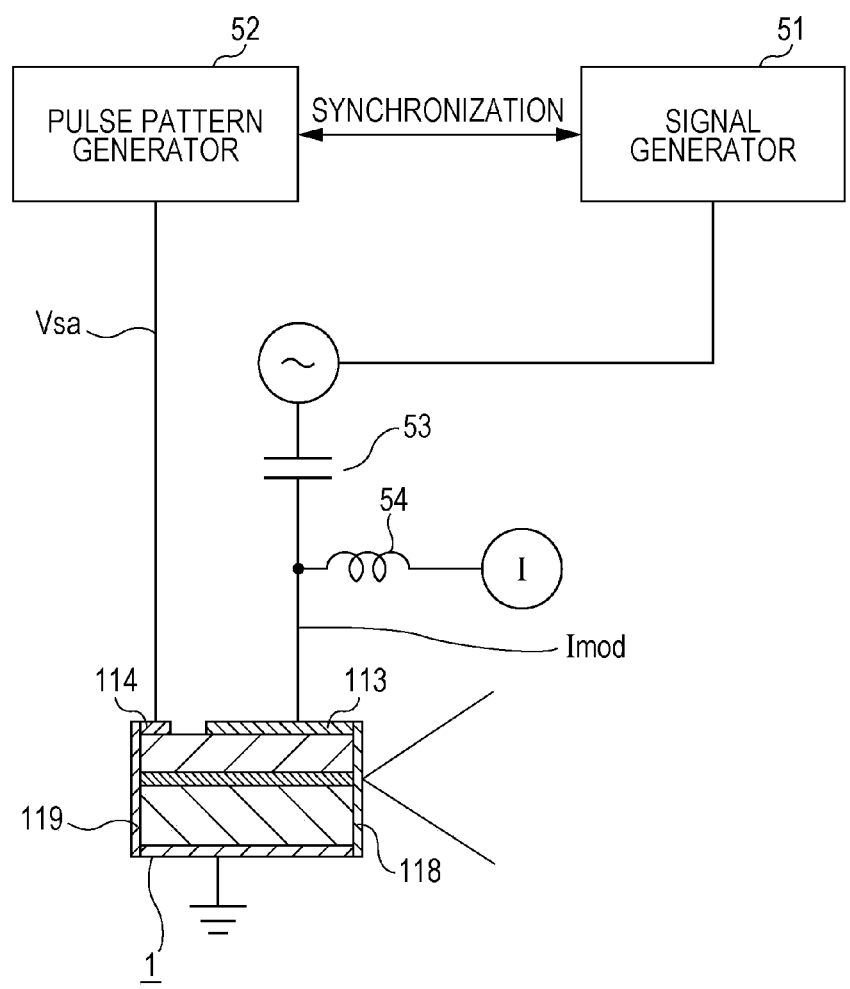
FIG. 5 illustrates a configuration used for an experiment.

The configuration used for this experiment is shown in FIG. 5.

As shown in FIG. 5, using a signal generator 51 and a pulse pattern generator (pulse generator) 52, these generators 51 and 52 were synchronized.

An alternating voltage (for example, 900 mVp-p) of a sine wave was applied to a capacitor 53 of a bias Tee including the capacitor 53 and a coil 54 and also a direct current I (for example, from 85 to 105 mA) was supplied to the coil 54 of the bias Tee from the signal generator 51. In such a manner, a pulsed current Imod was supplied to the electrode 113 of the gain section 116 of the self excited oscillation semiconductor laser 1.

In contrast, from the pulse pattern generator 52, the reverse bias voltage Vsa was supplied to the electrode 114 of the saturable absorber section 117 of the self excited oscillation semiconductor laser 1.

Figure 6:
FIG. 6 illustrates a reverse bias voltage supplied to a self excited oscillation semiconductor laser in an experiment 1.

In the experimental configuration shown in FIG. 5, the reverse bias voltage Vsa supplied from the pulse pattern generator 52 was supplied, as shown in FIG. 6, to the self excited oscillation semiconductor laser 1 as a constant voltage between −1 V and −2 V.

Then, the intensity of the optical output of the laser light emitted from the self excited oscillation semiconductor laser 1 was investigated.

Figure 7:
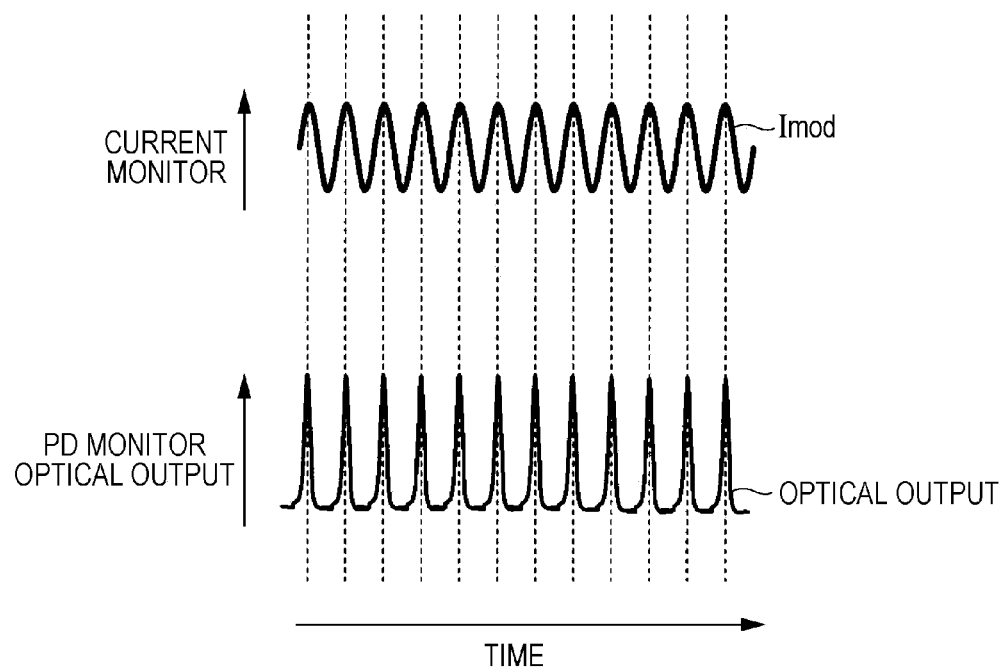
FIG. 7 illustrates a pulsed current Imod and an optical output from the self excited oscillation semiconductor laser in comparison.

At this time, as shown in FIG. 7, the pulsed current Imod obtained from the signal generator 51 via the bias Tee and the optical output from the self excited oscillation semiconductor laser 1 were synchronized with each other at a same frequency.

Next, when the reverse bias voltage Vsa was set at −2 V and the direct current I to be applied to the coil 54 of the bias Tee was set at 107 mA, the optical output from a photodiode PD that received the optical output from the self excited oscillation semiconductor laser 1 and the modulation signal were observed with an oscilloscope. Obtained waveforms are shown in FIG. 8.

Figure 8:
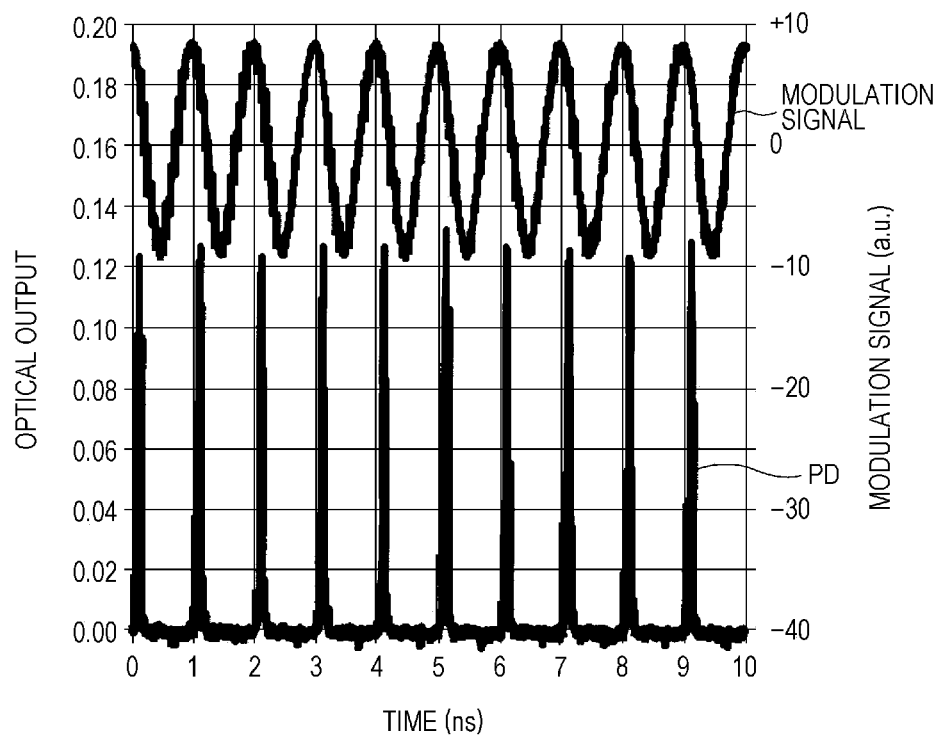
FIG. 8 illustrates an optical output received by a photodiode and a waveform of a modulation signal.

From FIG. 8, it is understood that the pulse width of the optical output was approximately 30 psec and the pulse interval was approximately 1 nsec. It is also understood that the optical output was synchronized with the modulation signal.

Experiment 2

Next, using the experimental configuration shown in FIG. 5, an experiment was carried out further to operate to modulate picosecond light emission data.

Figure 9:
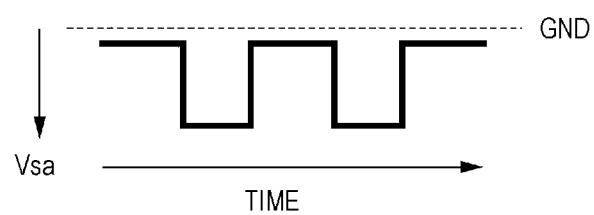
FIG. 9 illustrates a reverse bias voltage supplied to a self excited oscillation semiconductor laser in an experiment 2.

As the reverse bias voltage Vsa, a pulsed voltage shown in FIG. 9 was supplied. The minimum voltage of the pulse was set within a range of from −1 V to −2 V.

As shown in FIG. 10, the pulse of the reverse bias voltage Vsa was set to have a length of several (approximately eight in FIG. 10) pulses of the pulsed current Imod.

At this time, as shown in FIG. 10, in a period while the voltage pulse of the reverse bias voltage Vsa was at the minimum value, the optical output of the self excited oscillation semiconductor laser 1 became high, and in the other period, the optical output was drastically low.

It is ideal that the optical output in the other period is almost none.

Next, by changing the bias voltage Vsa, a change in the optical output from the self excited oscillation semiconductor laser 1 was investigated.

Figure 11A:
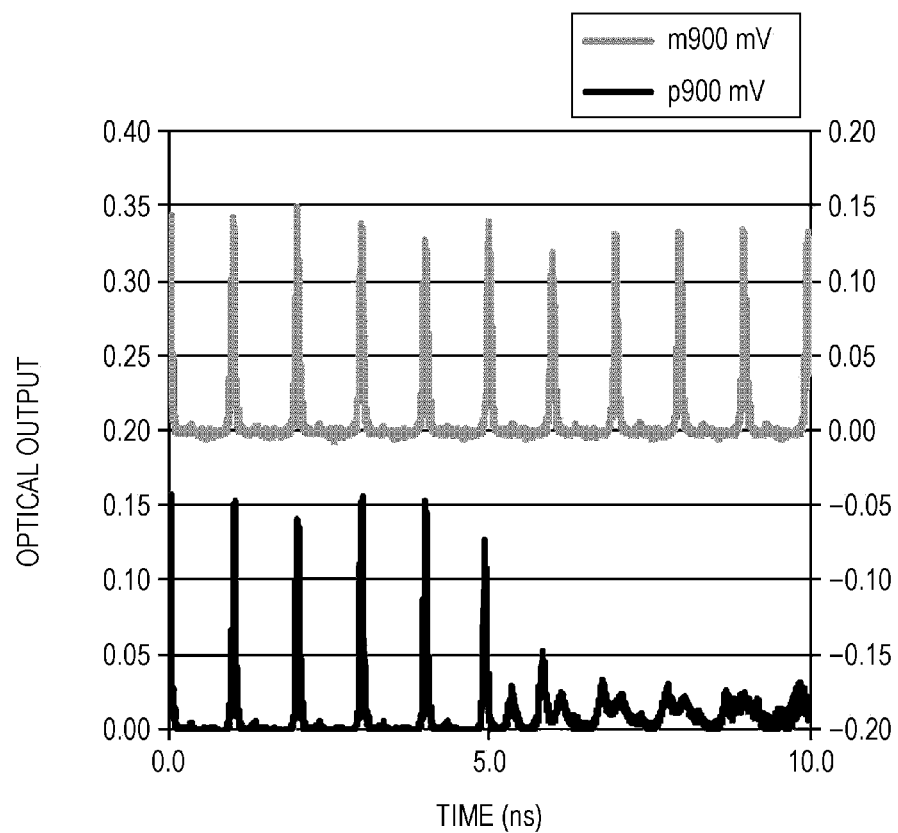
FIG. 11A illustrates temporal changes in optical outputs at respective bias voltages.
Figure 11B:
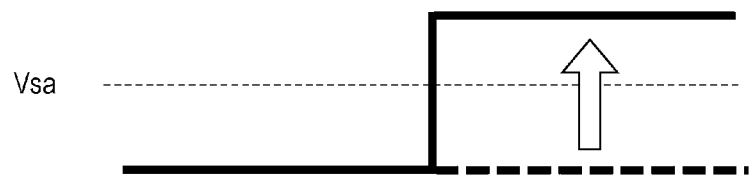
FIG. 11B illustrates the supplied bias voltages.

The temporal changes of the optical outputs in the respective bias voltages are shown in FIG. 11A. The upper part of FIG. 11A shows a case of continuously setting as Vsa=−900 mV (m900 mV), and the lower part of FIG. 11A shows a case of changing the Vsa from −900 mV to +900 mV (p900 mV). FIG. 11B is waveforms of the bias voltages Vsa, and the broken line corresponds to the waveform in the upper part of FIG. 11A and the solid line corresponds to the waveform in the lower part of FIG. 11A.

From FIGS. 11A and 11B, it is understood that, by changing the bias voltage Vsa from the reverse bias to a forward bias, the optical output from the self excited oscillation semiconductor laser 1 can be modulated to drastically reduce the optical output.

Accordingly, by changing the bias voltage, it is possible to turn on and off the optical output from the self excited oscillation semiconductor laser 1.

Experiment 3

Using the experimental configuration shown in FIG. 5, a change in the optical output of the self excited oscillation semiconductor laser 1 was investigated in a case of changing the bias voltage Vsa to be applied to the self excited oscillation semiconductor laser 1 from 0 V to −3 V.

FIG. 12A is the optical output of the self excited oscillation semiconductor laser 1 measured at this time, and FIG. 12B is the waveform of the bias voltage Vsa applied to the self excited oscillation semiconductor laser 1.

As understood from FIGS. 12A and 12B, when the bias voltage became −3 V, the optical output from the self excited oscillation semiconductor laser 1 became high, and thus it is confirmed that the optical output of the self excited oscillation semiconductor laser 1 can be controlled in accordance with the waveform of the applied bias voltage Vsa.

However, as shown in a region T1 in FIG. 12A, the self excited oscillation semiconductor laser 1 showed slight DC light emission even when the value of the bias voltage Vsa was 0 V.

On the other hand, a change in the optical output of the self excited oscillation semiconductor laser 1 was similarly investigated when changing the bias voltage Vsa to be applied to the self excited oscillation semiconductor laser 1 from −4.4 V to −3 V.

FIG. 13A is the optical output of the self excited oscillation semiconductor laser 1 at this time, and FIG. 13B is the waveform of the bias voltage Vsa applied to the self excited oscillation semiconductor laser 1. As shown in FIGS. 13A and 13B, it was confirmed that the self excited oscillation semiconductor laser 1 did not oscillate when the bias voltage Vsa was −4.4 V, and the self excited oscillation semiconductor laser 1 oscillated when the bias voltage Vsa was changed to −3 V.

When the bias voltage Vsa was −4.4 V, the DC light emission of the self excited oscillation semiconductor laser 1 was able to be suppressed. That is, by switching the bias voltage Vsa between −3.0 V and −4.4 V, it is possible to form an oscillation period of the self excited oscillation semiconductor laser 1 and a non-oscillation period of the self excited oscillation semiconductor laser 1. Accordingly, it is possible to securely switch the self excited oscillation semiconductor laser 1 between being turned on and off, and thus an accurate optical signal can be emitted.

FIG. 14A shows properties of the optical output of the self excited oscillation semiconductor laser 1 in a case of changing the bias voltage Vsa to be applied to the self excited oscillation semiconductor laser 1 from −3.6 V to −3.0 V, and FIG. 14B shows the waveform of the bias voltage Vsa at this time.

In this case, it was confirmed that the self excited oscillation semiconductor laser 1 oscillated both cases of when the bias voltage Vsa was −3.6 V and the bias voltage Vsa was −3.0 V. It should be noted that the oscillation frequency of the laser light became higher when the bias voltage Vsa was −3.0 V compared to when the bias voltage Vsa was −3.6 V.

A description is given below to these phenomena with reference to FIGS. 15 and 16.

Figure 15:
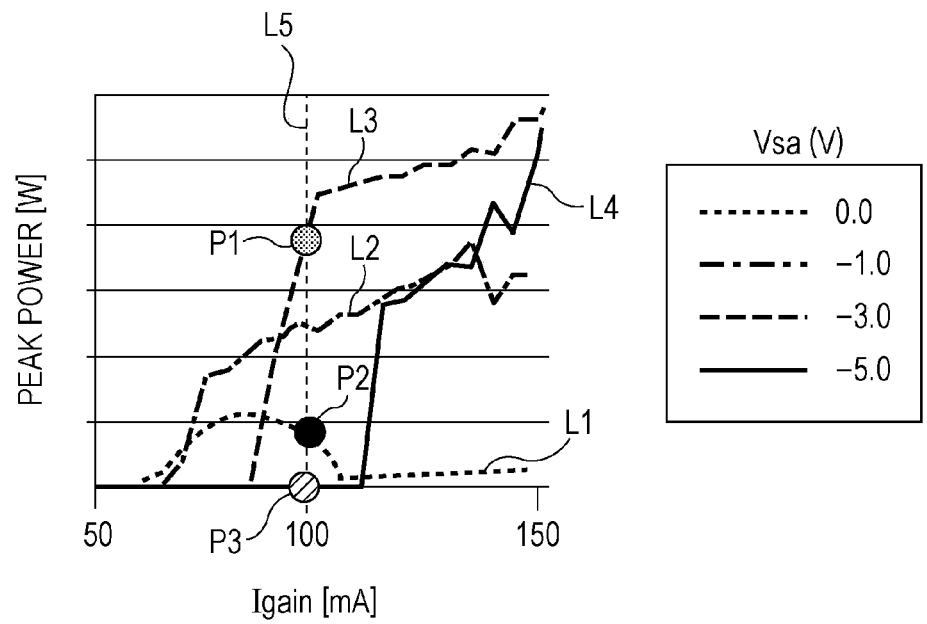
FIG. 15 illustrates relationship between a current injected to a self excited oscillation semiconductor laser and an optical output.

FIG. 15 illustrates relationship between a current value injected to the gain section 116 (refer to FIGS. 1A and 1B) of the self excited oscillation semiconductor laser 1 and the peak power of the laser light emitted from the self excited oscillation semiconductor laser 1.

The horizontal axis denotes the current value of the current injected to the gain section 116, and the vertical axis denotes the peak power of the laser light emitted from the self excited oscillation semiconductor laser 1.

Properties L1 to L4 denote changes in the optical output in respective cases that the bias voltage Vsa is 0 V, −1.0 V, −3.0 V, and −5.0 V.

As shown in the property L1, it was confirmed that the self excited oscillation semiconductor laser 1 oscillated even when the bias voltage Vsa was 0 V. It should be noted, though, that the peak power of the oscillated laser light was smaller in the case that the bias voltage Vsa was 0 V compared to the properties L2 to L4, which are the cases that the respective bias voltages Vsa were −1.0 V, −3.0 V, and −5.0 V.

From FIG. 15, it is understood that the current value desired for oscillation of the self excited oscillation semiconductor laser 1 becomes larger as the bias voltage Vsa becomes greater in the negative direction. For example, the self excited oscillation semiconductor laser 1 started oscillation at a current value injected to the gain section 116 of approximately 60 mA when the bias voltage Vsa was 0 V, whereas the semiconductor laser 1 started oscillation at a current value of approximately 85 mA when the bias voltage Vsa was −3.0 V. When the bias voltage Vsa is −5.0 V, a current value of 100 mA or more is desired for oscillation of the semiconductor laser 1.

For example, as shown in a line L5 in FIG. 15, a description is given to a case that the current value injected to the gain section 116 is approximately 95 mA. As shown at a point P1, the peak power of the laser light was large when the bias voltage Vsa was −3.0 V.

However, as shown at a point P2, even when the bias voltage Vsa was 0 V, the self excited oscillation semiconductor laser 1 oscillated though slightly. Accordingly, even when the bias voltage Vsa is changed from 0 V to −3.0 V, it is difficult to fully turn on and off the self excited oscillation semiconductor laser 1. That is, this case is equivalent to the experimental results shown in FIGS. 12A and 12B.

In contrast, as shown at a point P3, when the bias voltage Vsa was −5.0 V, the self excited oscillation semiconductor laser 1 did not oscillate. Accordingly, by changing the bias voltage Vsa from −5.0 V to −3.0 V, it is possible to easily switch the self excited oscillation semiconductor laser 1 between being turned on and off. This case is equivalent to the experimental results shown in FIGS. 13A and 13B.

Figure 16:
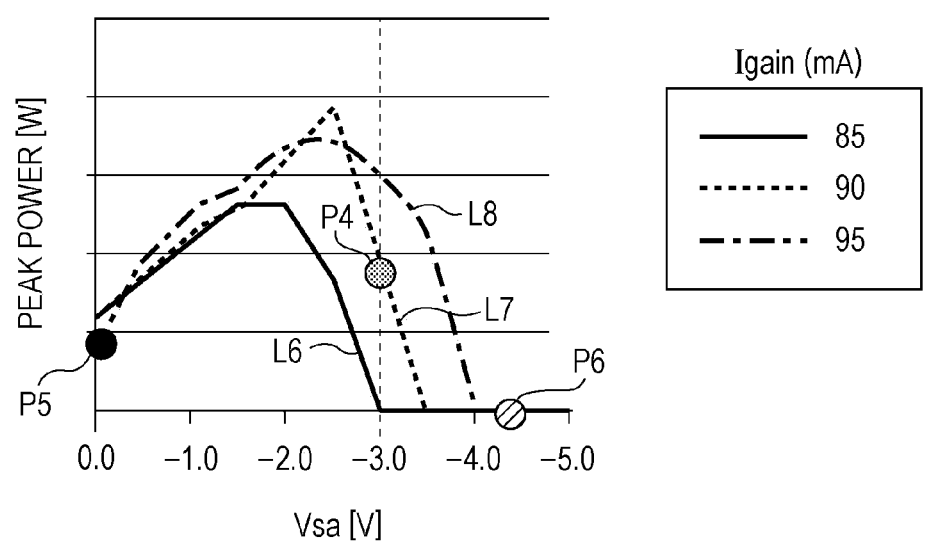
FIG. 16 illustrates relationship between a voltage applied to a self excited oscillation semiconductor laser and an optical output.

FIG. 16 illustrates relationship between the bias voltage Vsa applied to the self excited oscillation semiconductor laser 1 and the peak power of the laser light emitted from the self excited oscillation semiconductor laser 1. The horizontal axis denotes the bias voltage Vsa applied to the self excited oscillation semiconductor laser 1, and the vertical axis denotes the peak power of the laser light emitted from the self excited oscillation semiconductor laser 1.

Properties L6 to L8 respectively denote changes of the optical output in cases that the current value injected to the gain section 116 is 85 mA, 90 mA, and 95 mA.

As shown in FIG. 16, the peak power of the laser light emitted from the self excited oscillation semiconductor laser 1 became larger when the bias voltage Vsa became greater in the negative direction. However, when the bias voltage Vsa exceeded a predetermined value, the peak power of the laser light decreased and the laser light did not develop oscillation.

For example, a case of a property L7 is described, in which the current value injected to the gain section 116 was approximately 90 mA. As shown at points P4 and P5, when the bias voltage Vsa was changed from −3.0 V to 0 V, the peak power of the laser light decreases while the oscillation itself was not possible to be stopped. That is, at a property L8, the change in the output of the laser light relative to the change in the bias voltage Vsa from the point P4 to the point P5 is equivalent to the experimental results shown in FIGS. 12A and 12B.

In contrast, as shown at a point P6, when the bias voltage Vsa was −4.4 V, the self excited oscillation semiconductor laser 1 did not oscillate. Accordingly, as shown at the points P4 and P6, when the bias voltage Vsa is changed from −3 V to −4.4 V, the self excited oscillation semiconductor laser 1 can be fully stopped. That is, the change in the output of the laser light in this case is equivalent to the experimental results shown in FIGS. 13A and 13B.

Figures 17A, 17B:
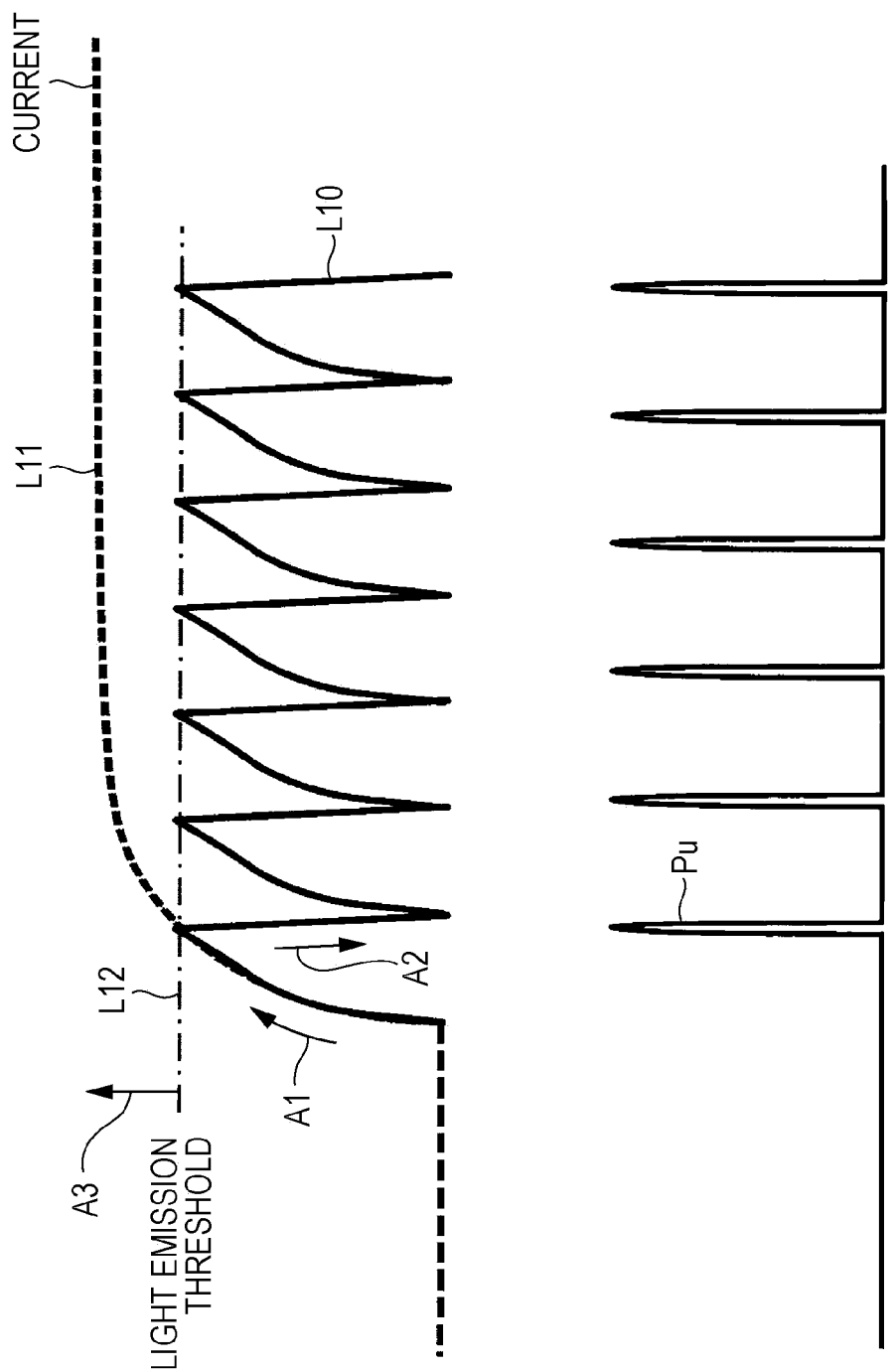
FIG. 17A illustrates a change in a density of an electric charge accumulated in a self excited oscillation semiconductor laser.
FIG. 17B illustrates a temporal change in an optical output of a self excited oscillation semiconductor laser.

FIG. 17A illustrates relationship between the current injected to the gain section 116 of the self excited oscillation semiconductor laser 1 and the density of an electric charge accumulated in the self excited oscillation semiconductor laser 1 due to the injection of the current, and FIG. 17B illustrates a waveform of the light emitted from the self excited oscillation semiconductor laser 1 at this time.

In FIG. 17A, a property L11 denotes a current value injected to the gain section 116 of the self excited oscillation semiconductor laser 1, and a property L10 denotes a density of an electric charge accumulated in the self excited oscillation semiconductor laser 1 at this time.

As shown with an arrow A1, as the current injected to the gain section 116 became larger, the density of the electric charge accumulated in the self excited oscillation semiconductor laser 1 became higher. Then, when the electric charge density reached the light emission threshold shown with a line L12, a pulsed light Pu shown in FIG. 17B was discharged. At this time, the electric charge was consumed by the discharge of the pulsed light, and as shown with an arrow A2, the electric charge density in the self excited oscillation semiconductor laser 1 decreased.

Then, the electric charge was accumulated in the self excited oscillation semiconductor laser 1 by the current injected again to the gain section 116, and when the electric charge density reached the light emission threshold of the line L12, the pulsed light was discharged. By repeating such a process, the self excited oscillation semiconductor laser 1 carries out continuous oscillation of the pulsed light.

The light emission threshold, shown with the line L12, relative to the electric charge density changes depending on the value of the bias voltage Vsa applied to the self excited oscillation semiconductor laser 1.

For example, when the bias voltage Vsa became greater in the negative direction, the light emission threshold relative to the density of the electric charge shown with the line L12 became larger as shown with an arrow A3. Therefore, since the time until the electric charge density reached the light emission threshold became longer, the interval to discharge the pulsed light became longer and the oscillation frequency of the self excited oscillation semiconductor laser 1 became smaller.

Therefore, in the experimental results shown in FIGS. 14A and 14B, when the bias voltage Vsa changed from −3.0 V to −3.6 V, the oscillation frequency of the laser light became smaller.

In contrast, other than being consumed by the discharge of the pulsed light, the electric charge accumulated in the self excited oscillation semiconductor laser 1 is also lost by being naturally discharged from the self excited oscillation semiconductor laser 1. Therefore, there is a limitation on the amount of electric charge (electric charge density) that can be accumulated in the self excited oscillation semiconductor laser 1.

Accordingly, when the value of the bias voltage Vsa is set to be excessively greater in the negative direction, the light emission threshold becomes excessively large relative to the accumulable electric charge density and the electric charge density turns out not to be able to be increased to the light emission threshold. Therefore, as shown in FIG. 16, when the bias voltage Vsa becomes as large as to the predetermined value in the negative direction, the self excited oscillation semiconductor laser 1 turns out not to oscillate.

In such a manner, the bias voltage Vsa has a threshold at which the self excited oscillation semiconductor laser 1 comes not to oscillate in the region of a negative value. Accordingly, when the self excited oscillation semiconductor laser 1 is switched between being turned on and off, it is preferred to set the bias voltage Vsa when turned off at a value greater in the negative direction than this threshold. In other words, in the self excited oscillation semiconductor laser 1 thus set, the bias voltage Vsa in the non-oscillation period while oscillation of the laser light is stopped becomes greater in the negative direction than the bias voltage Vsa in the oscillation period while oscillation of the laser light is carried out.

By carrying out such a setting, the self excited oscillation semiconductor laser 1 can be switched between being turned on and off with better precision.

Embodiments of the present technology are not limited to the embodiments and the experimental examples mentioned above, but can be configured in various other ways without departing from the spirit of embodiments of the present technology.

Embodiments of the present technology can also have a configuration as follows.

(1)

A recording device recording information in an optical recording medium, the recording device including: a self excited oscillation semiconductor laser including a saturable absorber section to apply a bias voltage and a gain section to inject a gain current, and also emitting a laser light to record the information in the optical recording medium; a reference signal generation unit generating a master clock signal and also supplying an injection signal synchronized with the master clock signal to the gain section of the self excited oscillation semiconductor laser; and a recording signal generation unit generating a recording signal based upon the master clock signal and also applying the recording signal to the saturable absorber section of the self excited oscillation semiconductor laser as the bias voltage.

(2)

The recording device according to (1), wherein a signal obtained from wobble formed in a groove of the optical recording medium is supplied to the recording signal generation unit.

(3)

The recording device according to (1) or (2), wherein the self excited oscillation semiconductor laser has a double quantum well separate confinement heterostructure with a GaInN/GaN/AlGaN material.

(4)

The recording device according to (1) through (3), wherein the bias voltage is a negative value, and the bias voltage in a non-oscillation period of the self excited oscillation semiconductor laser is greater in a negative direction than the bias voltage in an oscillation period of the self excited oscillation semiconductor laser.

(5)

An optical oscillator device, including: a self excited oscillation semiconductor laser including a saturable absorber section applying a bias voltage and a gain section injecting a gain current, and also emitting a laser light; a reference signal generation unit generating a master clock signal and also supplying an injection signal synchronized with the master clock signal to the gain section of the self excited oscillation semiconductor laser; and an emission signal generation unit generating a predetermined signal based upon the master clock signal, and also applying the predetermined signal to the saturable absorber section of the self excited oscillation semiconductor laser as the bias voltage.

What is claimed is:

1. A recording device recording information in an optical recording medium, the recording device comprising:
    a self excited oscillation semiconductor laser including a saturable absorber section to apply a bias voltage and a gain section to inject a gain current, and also emitting a laser light to record the information in the optical recording medium;
    a reference signal generation unit generating a master clock signal and also supplying an injection signal synchronized with the master clock signal to the gain section of the self excited oscillation semiconductor laser; and
    a recording signal generation unit generating a recording signal based upon the master clock signal and also applying the recording signal to the saturable absorber section of the self excited oscillation semiconductor laser as the bias voltage.

2. The recording device according to claim 1, wherein a signal obtained from wobble formed in a groove of the optical recording medium is supplied to the recording signal generation unit.

3. The recording device according to claim 1, wherein the self excited oscillation semiconductor laser has a double quantum well separate confinement heterostructure with a GaInN/GaN/AlGaN material.

4. The recording device according to claim 3, wherein the bias voltage is a negative value, and the bias voltage in a non-oscillation period of the self excited oscillation semiconductor laser is greater in a negative direction than the bias voltage in an oscillation period of the self excited oscillation semiconductor laser.

5. An optical oscillator device, comprising:
    a self excited oscillation semiconductor laser including a saturable absorber section applying a bias voltage and a gain section injecting a gain current, and also emitting a laser light;
    a reference signal generation unit generating a master clock signal and also supplying an injection signal synchronized with the master clock signal to the gain section of the self excited oscillation semiconductor laser; and
    an emission signal generation unit generating a predetermined signal based upon the master clock signal, and also applying the predetermined signal to the saturable absorber section of the self excited oscillation semiconductor laser as the bias voltage.

* * * * *